(12) United States Patent
Damberg et al.

(10) Patent No.: US 7,521,785 B2
(45) Date of Patent: Apr. 21, 2009

(54) PACKAGED SYSTEMS WITH MRAM

(75) Inventors: Philip Damberg, Cupertino, CA (US); Nicholas J. Colella, Pleasanton, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 11/018,969

(22) Filed: Dec. 21, 2004

(65) Prior Publication Data
US 2005/0184399 A1    Aug. 25, 2005

Related U.S. Application Data

(60) Provisional application No. 60/532,213, filed on Dec. 23, 2003.

(51) Int. Cl.
*H01L 23/02* (2006.01)
(52) U.S. Cl. ........................... 257/686; 257/777
(58) Field of Classification Search ............ 257/777, 257/686
See application file for complete search history.

(56) References Cited

U.S. PATENT DOCUMENTS

| | | | |
|---|---|---|---|
| 5,138,438 A | 8/1992 | Masayuki et al. | |
| 5,148,265 A | 9/1992 | Khandros | |
| 5,148,266 A | 9/1992 | Khandros et al. | |
| 5,165,265 A | 11/1992 | Maionchi | |
| 5,489,749 A | 2/1996 | DiStefano | |
| 5,608,262 A | 3/1997 | Degani et al. | |
| 5,679,977 A | 10/1997 | Khandros | |
| 5,801,072 A | 9/1998 | Barber | |
| 5,869,894 A | 2/1999 | Degani et al. | |
| 5,915,752 A | 6/1999 | DiStefano | |
| 6,225,688 B1 | 5/2001 | Kim | |
| 6,417,688 B1 | 7/2002 | Dabral et al. | |
| 6,462,421 B1 | 10/2002 | Hsu et al. | |
| 6,555,917 B1 * | 4/2003 | Heo | 257/777 |

FOREIGN PATENT DOCUMENTS

EP    1579477    9/2005

OTHER PUBLICATIONS

Bang, et al., U.S. Appl. No. 10/640,177, filed Aug. 13, 2003.
Bang, et al., U.S. Appl. No. 10/654,375, filed Sep. 3, 2003.
Beroz et al., U.S. Appl. No. 60/462,170, filed Apr. 11, 2003.
Damberg et al., U.S. Appl. No. 60/490,802, filed Jul. 28, 2003.
Fjelstad, U.S. Appl. No. 10/077,388, filed Feb. 15, 2002.
Kang et al., U.S. Appl. No. 10/655,952, filed Sep. 5, 2003.
Pflughaupt et al., U.S. Appl. No. 10/454,029, filed Jun. 4, 2003.

(Continued)

*Primary Examiner*—Douglas M Menz
(74) *Attorney, Agent, or Firm*—Lerner, David, Littenberg, Krumholz & Mentlik, LLP

(57) ABSTRACT

A semiconductor assembly includes plural chips stacked one above the other. One or more of the chips is a magnetic random access memory (MRAM). Use of MRAM alleviates problems caused by heat dissipation in the stack.

9 Claims, 2 Drawing Sheets

OTHER PUBLICATIONS

Pflughaupt et al., U.S. Appl. No. 10/267,450, filed Oct. 9, 2002.
Thompson et al., U.S. Appl. No. 60/517,179, filed Oct. 29, 2003.
Warner et al., U.S. Appl. No. 10/281,550, filed Oct. 28, 2002.
Warner, U.S. Appl. No. 10/210,160, filed Aug. 1, 2002.

* cited by examiner

PACKAGED SYSTEMS WITH MRAM

CROSS-REFERENCE TO RELATED APPLICATION

The present application claims the benefit of the filing date of U.S. Provisional Patent Application No. 60/532,213 filed Dec. 23, 2003, the disclosure of which is hereby incorporated herein by reference.

BACKGROUND OF THE INVENTION

Semiconductor chips are commonly provided in packages which physically protect the semiconductor chip itself and which facilitate mounting of the chip to a circuit panel. Significant development has occurred in such packages, so as to reduce the size of the package relative to the size of the chip itself, and to provide packages which are compatible with modern circuit panel assembly techniques such as surface-mounting.

Semiconductor chips ordinarily are generally planar, thin elements having a front surface with contacts thereon connected to the internal semiconductor elements of the chips, an opposite, rear surface and edges extending between these front and rear surfaces. As used herein with reference to a semiconductor chip, the term "area" refers to the area of the front or rear surface of the chip. Certain chips, commonly referred to as "chip size packages" occupy an area of the circuit panel equal to the area of the chip itself, or only slightly larger than the area of the chip itself. Certain semiconductor chips have been provided heretofore in stacked arrangements so that the chips are superposed on one another, with the front or rear surface of one chip facing toward the front or rear surface of another chip. In many cases, the chips are functionally related to one another, so that they must be interconnected to one another. Such a stacked assembly can incorporate some or all of the required interconnections between the chips and, in some cases, can be prefabricated so that the stacked assembly may be handled, stocked and assembled to a larger circuit panel as a unit.

Stacking chips in this manner reduces the aggregate area of the circuit panel occupied by the chips. However, stacked chip arrangements suffer from some drawbacks with respect to heat dissipation. All else being equal, two chips mounted in a stacked arrangement will normally have higher internal temperatures than two individual chips mounted on separate portions of the circuit board. In some cases, this drawback precludes the use of stacked chips or requires expensive special cooling measures.

It is particularly desirable to provide a logic chip such as a processor or, particularly, a field programmable gate array ("FPGA") in a stacked package with memory used in conjunction with the logic chip. FPGAs typically are used with external memory chips. In some cases, the FPGA incorporates a small internal memory adequate for some applications, but not adequate for all applications. In other cases, the FPGA incorporates no internal memory at all. Because the FPGA exchanges large amounts of data at frequent intervals with the external memory, it is important to minimize signal propagation delays between the FPGA and the external memory chip. Also, numerous signal lines are required for this data interchange. If the FPGA and the external memory chip are both mounted separately on a circuit panel, the circuit panel must accommodate all of these signal lines, which may require a complex circuit panel with numerous layers of conductive traces. This, in turn, significantly increases the costs and reduces the reliability of the overall assembly.

SUMMARY OF THE INVENTION

One aspect of the present invention incorporates the realization that magnetic random access memory chips (hereinafter "MRAM chips") are uniquely well-suited for mounting in stacked arrangements. As further discussed below, a semiconductor assembly according to this aspect of the invention desirably includes a bottom chip and one or more upper chips superposed on the bottom chip, so that the chips constitute a stack, at least one of the chips in the stack being a first MRAM chip. The assembly according to this aspect of the invention further includes stack terminals connected to at least one of the chips in the stack, the stack terminals being adapted to connect the chips to a circuit panel when the stack is mounted to a circuit panel with the bottom chip adjacent the circuit panel.

In a particularly preferred arrangement, the chips in the stack include a first logic chip which is electrically connected to the first MRAM chip. These two chips may be the only chips in the only stack or, alternatively, additional chips can be provided. The assembly may include a package element in the form of a small circuit panel bearing the stack terminals and other conductive features discussed below. The FPGA may be directly and permanently mounted to the package element. Stated another way, the package element may serve as a part of the package for the FPGA chip. For example, the FPGA chip may be provided pre-assembled to the package element of the stacked assembly by the FPGA manufacturer. This allows a circuit designer to select different MRAM chips for inclusion in a stack used for different applications. Typically, the separate MRAM chip is provided in a separate MRAM package, which can be mounted to the pre-assembled FPGA chip and package element

DETAILED DESCRIPTION

Figure 1:
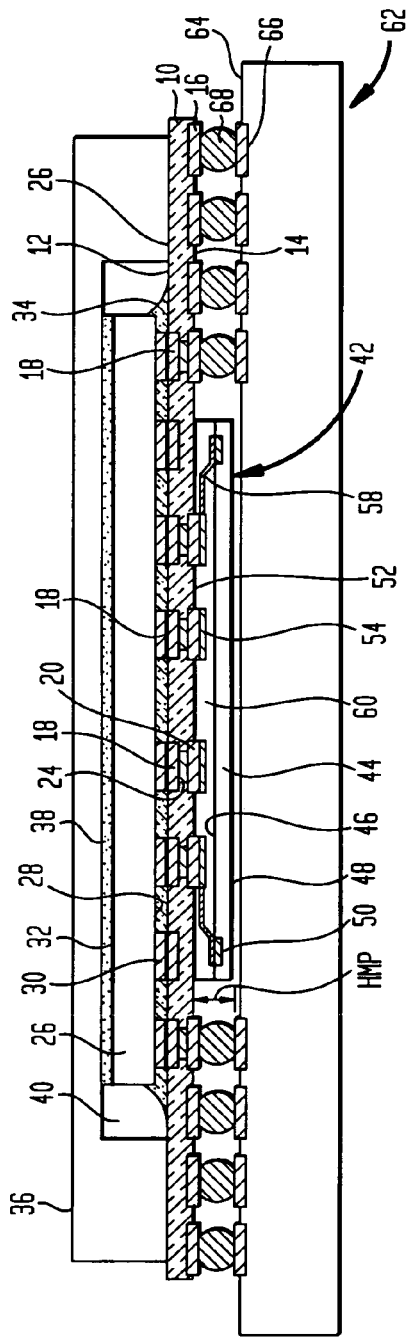
FIG. 1 is a diagrammatic sectional view depicting an assembly in accordance with one embodiment of the invention.
Figure 2:
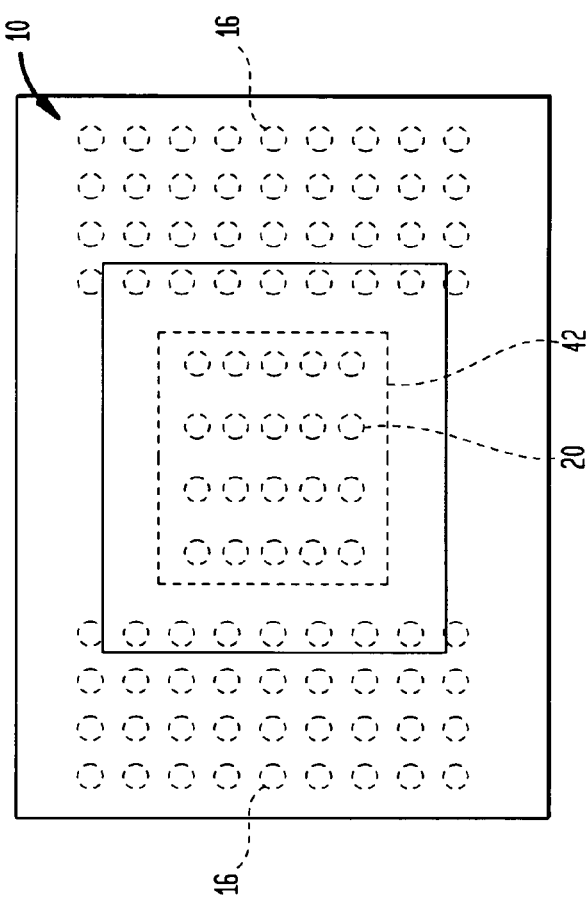
FIG. 2 is a top plan view of the assembly shown in FIG. 1 with some elements removed for clarity of illustration.

As seen in FIG. 1, an assembly according to one embodiment of the invention includes a package element 10 having a top surface 12 and a bottom surface 14. The package element may be a single-layer or multi-layer circuit panel incorporating one or more layers of a dielectric material and one or more layers of conductive features. The conductive features include stacked terminals 16 exposed at the bottom surface 14, logic chip mounting pads 18 exposed at the top surface 12, and MRAM chip mounting pads 20. As used in this disclosure, a terminal or other conductive feature is regarded as "exposed at" a surface of a dielectric element where the terminal is arranged so that all or part of the conductive feature can be seen by looking at such surface. Thus, a conductive feature which is exposed at a surface of a dielectric element may project from such surface; may be flush with such surface; or may be recessed from such surface and exposed through an opening extending entirely or partially through the dielectric element. As best seen in FIG. 2, the stack terminals 16 are disposed in two stack terminal areas near opposite edges of the package element 10, whereas the MRAM chip mounting pads 20 are disposed in an MRAM chip mounting area near the center of the bottom surface, between the stack terminal areas.

In a variant, the stack terminals can be provided along all four edges of the package element as, for example, in an array forming a rectangular ring encircling the mounting pad area on the bottom surface of the package element. The logic chip mounting pads 18 are omitted in FIG. 2 for clarity of illustration. At least some of the logic chip mounting pads 18 are connected to at least some of the MRAM chip mounting pads 20 as, for example, by vias 24 extending between the logic chip mounting pads and the MRAM chip mounting pads. Also, at least some of the logic chip mounting pads 18 are connected to at least some of the stack terminals 16 as, for example, by traces 26 extending on package element 10. As used in this disclosure, a statement that a feature is located "on" an element does not necessarily mean that the feature is disposed on a surface of such element. For example, traces 26 may be disposed on the top surface or bottom surface of package element 10, or may be disposed inside of such element.

Desirably, at least some of the MRAM chip mounting pads 20 and logic chip mounting pads 18, which are connected to one another, are also aligned with one another so that they may be interconnected by very short vias extending vertically through the package element, with or without short additional traces extending in horizontal directions parallel to the surfaces of the package element. Indeed, a common pad may be exposed at both top and bottom surfaces of the package element so that the same pad serves both as a logic chip mounting pad and as an MRAM chip mounting pad. Some of the MRAM chip mounting pads 20 may be connected to some of the stack terminals 16 by additional conductive elements (not shown). Package element 10 optionally may have additional features such as conductive ground planes (not shown).

A first logic chip 26, in this embodiment an FPGA chip, having a front face 28 with contacts 30 thereon and an oppositely-directed rear face 32 is mounted front-face down on top of package element 10, so that the first logic chip overlies the top surface 12 of the package element. Some or, more typically, all of contacts 30 on the logic chip are aligned with some or, typically, all of the logic chip mounting pads 18 and bonded to such pads so that the contacts of the logic chip are electrically connected to the logic chip mounting pads. The contacts and pads may be bonded by any conventional method as, for example, by diffusion bonding, soldering, eutectic bonding or the like. An encapsulant or underfill material 34 desirably surrounds the front face and edges of the first logic chip 26 and also penetrates between the first logic chip and the package element in areas unoccupied by the connected pads and contacts.

A thermally-conductive, desirably metallic heat spreader 36 overlies the upwardly-facing rear surface 32 of the first logic chip and is in intimate thermal communication with the first logic chip. Preferably, a thermally-conductive composition such as an adhesive, gel or paste 38, or a metallic bond such as a solder bond, connects the rear surface of the first logic chip to the thermal spreader. Although encapsulant underfill 34 and thermally-conductive filler 38 are shown as physically separate elements, these elements may be formed from portions of the same material, or from portions of different materials which abut one another within the interior space 40 defined by the thermal spreader 36.

The subassembly of the first logic chip and package element preferably is prefabricated. That is, the package element 10, along with the underfill and, optionally, the heat spreader 36, act as a package for the first logic chip or FPGA 26. Typically, such a subassembly is fabricated in a chip packaging plant associated with the FPGA manufacturer.

The assembly further includes a packaged MRAM chip 42 incorporating an MRAM chip 44 having a front face 46, a rear face 48 and contacts 50 exposed at the front face. The packaged MRAM chip 42 also includes an MRAM chip package substrate 52 bearing MRAM chip package terminals 54 separate from contacts 50, but electrically connected thereto. MRAM chip package terminals 54 overlie the front face 46 of the MRAM chip 44 itself and are connected to the contacts 50 of the MRAM chip by leads 58. MRAM chip package terminals 54 are exposed at the side of MRAM chip package substrate 52 facing away from the MRAM chip (facing upwardly in FIG. 1). For example, the MRAM chip package terminals maybe disposed on the inwardly-facing side of the package substrate, but exposed through holes in the MRAM chip package substrate. The MRAM chip package substrate 52 and MRAM chip package terminals 54 may be spaced form the front surface 46 of the MRAM chip by an intermediate layer 60, which optionally may be a compliant layer. Most preferably, packaged MRAM chip 42 is in the form of a low-profile, chip-size package having an area substantially equal to, or just slightly larger than, the areas of the MRAM chip surfaces themselves.

Desirably, the height or vertical dimension $H_{MP}$ of the MRAM chip package as a whole is less than about 500 microns, preferably less than about 300 microns. The height HMP of the packaged MRAM chip desirably exceeds the height or thickness of the MRAM chip 44 by about 200 microns or less, preferably about 150 microns or less.

Suitable packaging arrangements for chips in general, which can be used to form the packaged MRAM chip, are disclosed, for example, in U.S. Pat. Nos. 5,679,977; 5,489,749; and 5,915,752, the disclosures of which are hereby incorporated by reference herein. Typically, the packaged MRAM chip is pre-assembled in a packaging operation separate from the operations used to make the remaining components of the assembly, and the packaged MRAM chip can be sold, shipped and stacked. MRAM chips, per se, are known in the art and are commercially available from sources such as Motorola and others.

The packaged MRAM chip is mounted below the package element 10 so that the packaged MRAM chip occupies the MRAM chip mounting area and overlies the MRAM chip mounting pads 20, and so that the MRAM chip package terminals 54 are aligned with the MRAM chip mounting pads. Thin layers of solder are other conductive bonding materials connect the MRAM chip package terminals 54 with the MRAM chip mounting pads 20. Such a connection is commonly referred to as a land grid array ("LGA") and effectively minimizes the height $H_{MP}$ of the packaged MRAM chip.

The operation of attaching the packaged MRAM chip 42 to the packaged FPGA (chip 26 and package element 10) can be performed using techniques similar to those used in surface-mounting chips to circuit boards, and may be performed either in the same plant which ultimately employs the assembly, as discussed, or in another plant. With the packaged MRAM chip mounted to the package element 10, the first MRAM chip 44 lies below the first logic chip or FPGA 26, with the chips disposed in front-face-to-front-face orientation and with package element 10 disposed between the chips. The MRAM chip 44 is interconnected with the first logic chip or FPGA 26 through the conductive features of the package element 10, and through the MRAM chip package terminals 54. These interconnections provide numerous signal paths between the MRAM chip and the first logic chip, such signal paths having short signal propagation times.

The assembly discussed above can be mounted to a circuit panel such as a printed circuit board 62 having a top surface 64 and conductive features such as board mounting pad 66 exposed at the top surface. The assembly overlies the top surface with stack terminals 16 aligned with the board mounting pads and connected thereto by conductive attachments such as solder balls 68. The entire assembly can be mounted to the circuit panel in a single operation using generally conventional surface-mounting techniques. In the completed assembly, the conductive mounting elements or solder balls 68 project downwardly from stack terminals 16 and support package element 10 above the top surface of the circuit panel so as to provide clearance for the packaged MRAM chip. The board mounting pads 66 are connected to other elements of a larger electronic device (not shown) by traces or other conductive features (not shown) on the circuit panel 66. As depicted, circuit panel 66 is a conventional circuit board. However, other types of circuit panels may be employed. For example, circuit panel 66 itself may be the substrate of a multi-chip module or other subassembly which, in turn, can be mounted to a larger circuit panel. Also, circuit panel 66 may be part of another element, such as, for example, a large semiconductor chip.

In operation, the MRAM chip and FPGA or first logic chip act as a self-contained system which communicates with the larger assembly through stack terminals 16 and the associated elements of the circuit panel. The circuit panel 62 need not provide for interconnections between the MRAM chip and the first logic chip. Moreover, the combination including the MRAM chip provides a unique advantage, in that the MRAM chip has substantially lower power dissipation than other forms of memory having comparable speed and memory density (or number of memory elements per unit volume). For example, the MRAM chip dissipates substantially less power than SRAM or DRAM chips of comparable memory density and size. This difference in power dissipation is particularly important in a stacked arrangement as shown, where heat must be dissipated from both the memory chip and the logic chip.

Use of a separately-packaged MRAM chip as an element in the assembly provides considerable versatility. Packaged logic chips or FPGAs 26 of a given design and including a package element 10 of a given design may be assembled with MRAM chips of varying capacities to provide assemblies having different capabilities, as desired to meet particular requirements. The different MRAM chips can be provided with MRAM chip package substrates 52 having MRAM chip terminals 54 in the same arrangement, so that all are compatible with a given package element 10. The assemblies can be made as needed in a surface-mounting plant, so that there is no need to stock prepackaged assemblies with different MRAM chips for different applications.

Numerous variations and combinations of the features discussed above can be employed. For example, a "bare" or unpackaged MRAM chip can be substituted for the packaged MRAM chip depicted. Further, the MRAM chips need not be in the front-face-to-front-face orientation shown. For example, the logic chip or FPGA may be mounted "face-up" on the package element 10 and connected to the connective features of the package element by leads such as wire bonds. Similarly, the MRAM chip may be mounted with its front face facing away from the MRAM chip package substrate (where employed) or facing away from package element 10. In the embodiment depicted in FIGS. 1 and 2, the MRAM chip lies at the bottom of the stack, whereas the logic chip or FPGA lies at the top of the stack, above the MRAM chip. This arrangement can be reversed, so that the logic chip lies below the MRAM chip.

Figure 3:
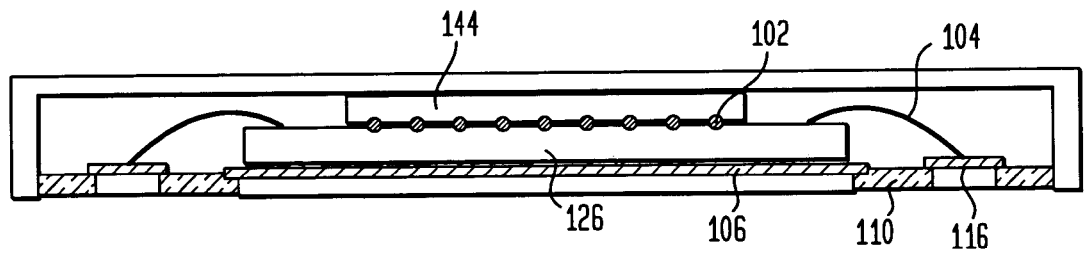
FIGS. 3, 4 and 5 are diagrammatic sectional views of assemblies according to further embodiments of the invention.

Other stack packaging arrangements may be employed. For example, in the assembly of FIG. 3, a bare or unpackaged MRAM chip 144 is mounted face-to-face with a bare or unpackaged logic chip or FPGA 126, and some of the terminals of the FPGA are connected to terminals of the MRAM chips by bonds 102. The rear surface of the FPGA overlies a package element 110 bearing stack terminals 116, which, in turn, are connected to contacts of the FPGA lying outside of the area covered by the MRAM chip using leads such as wire bonds 104. In this arrangement, the stack terminals 116 may be arranged for surface-mounting to a circuit panel (not shown) using a low-height bonding method such as an LGA. Also, as described more fully in co-pending U.S. patent application Ser. Nos. 10/210,160 and 60/462,170, the disclosures of which are hereby incorporated by reference herein, the package element may include a thermal conductor 106 which is exposed at the bottom surface of the package element as, for example, through a hole in the dielectric layer of the package element. Such a thermal conductor may be bonded to a thermally-conductive element of the circuit panel, such as a large metallic pad, to provide greater heat dissipation from the stack, thus compounding the advantages obtained through the use of an MRAM chip in the stack.

Figure 4:
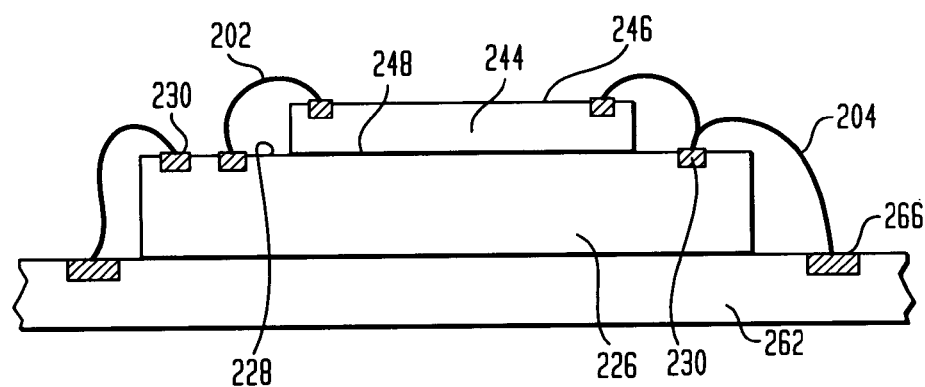

As seen in FIG. 4, a simpler stacked assembly includes a top chip 244, which, in this case, is an MRAM chip, mounted directly on a bottom chip 226, in this case a logic chip. The contact-bearing front face 246 of the MRAM chip and the contact-bearing front face 228 of the logic chip both face upwardly. The rear face 248 of the MRAM chip is bonded to the front face of the logic chip 226. The chips are interconnected to one another by wire bonds 202 extending between the contacts of the two chips. In this case, the terminals for the stack are provided by some of the contacts 230 of the logic chip itself. When the stack is mounted on a circuit panel 262, the exposed contacts 230 of the logic chip can be connected to pads 266 of the circuit panel by further wire bonds 204. Thus, in this case, the stack assembly does not include a separate package element.

Numerous other physical configurations incorporating stacked semiconductor chips are possible. For example, as disclosed in U.S. Pat. No. 6,225,688 and in co-pending, commonly assigned U.S. patent application Ser. Nos. 10/281,550; 10/077,388; 10/655,952; 10/640,177; and 10/654,375, a stacked arrangement can be made by securing a plurality of chips to a substrate and folding the substrate so that the chips overlie one another. The disclosures of these patents and applications are hereby incorporated by reference herein. Certain other stacked chip arrangements are disclosed in the aforementioned '977 patent and in U.S. Pat. No. 5,148,265, the disclosure of which is hereby incorporated by reference herein. All of these stacked arrangements may be employed.

In another configuration (FIG. 5), a stacked chip assembly includes a plurality of units which are similar to one another. Each unit includes one or more chips 346 and a unit substrate 310 having unit terminals 304 thereon. The unit terminals 304 of each such unit are connected to the chip or chips included in that unit as, for example, by traces and leads 308 carried on the unit substrate. The unit terminals are arranged so that connections can be made to these terminals either from above or below the unit. Plural units are superposed on one another and connected by inter-unit connecting elements such as solder balls 309, so as to form a stacked assembly. The unit interconnect elements form vertical buses which connect the chips in the various units to one another. These buses can be connected by stack-mounting elements 368 to pads 366 on a circuit panel 362. Arrangements of this type can be used with various types of chips, but are particularly useful in arrangements where some or all of the chips in the various units are identical to one another as, for example, in stacks incorporating plural memory chips. Multi-unit stacks are further discussed in co-pending, commonly assigned U.S. patent application Ser. Nos. 10/267,450 and 10/454,029, the disclosures of which are also hereby incorporated by reference herein.

Figure 5:
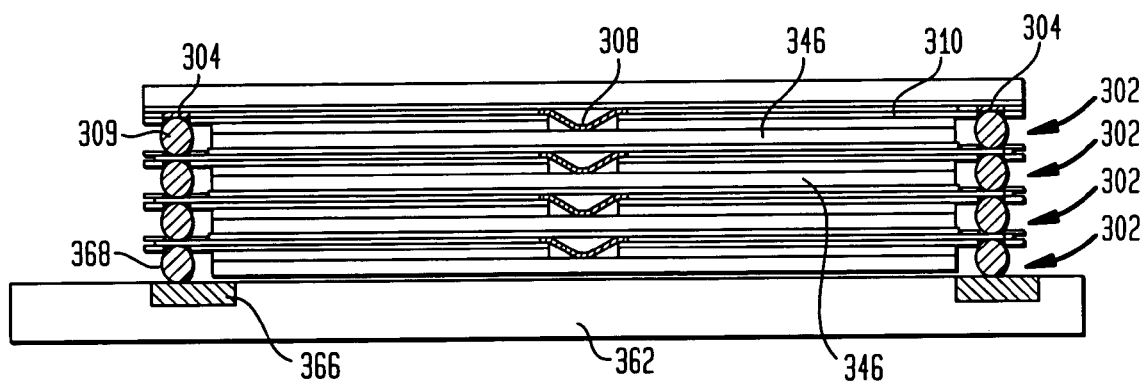

In the embodiment of FIG. 5, all of the chips in the stack may be MRAM chips. Such a stack can be used to provide a compact, high-capacity MRAM chip unit which can be mounted on a small area of the circuit panel. MRAM chips are particularly advantageous in a multi-unit stack containing plural memory chips, because, here again, the low power dissipation of MRAM chips simplifies the task of cooling the chips in the stack. In this embodiment as well, the low power dissipation of the MRAM chips can allow for greater stack heights with more chips than could be accommodated in a comparable stack of SRAM or DRAM chips. Conversely, the use of MRAM chips in such a memory stack can eliminate the need for special cooling measures such as mist cooling or forced air circulation required for a comparable DRAM or SRAM stack. These advantages are particularly pronounced in a system which incorporates plural stacks of chips on a circuit board or on a module substrate, as taught, for example, in co-pending, commonly assigned U.S. Provisional Patent Application Ser. Nos. 60/490,802 and 60/517,179, the disclosures of which are also incorporated by reference herein.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A stacked chip assembly, comprising:
a plurality of stacked units each including a plurality of unit terminals, said unit terminals of respective stacked units being interconnected via inter unit connecting elements, each of said units including:
a magnetic random access memory ("MRAM") chip having a face and contacts exposed at the face;
a logic chip having a face and contacts exposed at the face;
a package element including a dielectric element having top and bottom surfaces, MRAM chip mounting terminals exposed at said bottom surface and logic chip mounting terminals exposed at said top surface, at least some of said MRAM chip mounting terminals being connected to at least some of said logic chip mounting terminals through said dielectric element;
mounting masses conductively connecting said contacts of said MRAM chip to said MRAM chip mounting terminals; and
mounting masses conductively connecting said contacts of said logic chip to said logic chip mounting terminals.

2. The assembly of claim 1, wherein in each said unit, said logic chip has a larger area than said MRAM chip and said logic chip projects laterally beyond said MRAM chip.

3. The assembly of claim 1, wherein each unit further includes a thermally-conductive heat spreader overlying said logic chip and in thermal communication therewith.

4. The assembly of claim 1, further comprising a circuit panel conductively connected to said unit terminals.

5. The assembly of claim 1, wherein each said package element includes vias extending between said top and bottom surfaces, said vias conductively connecting said at least some MRAM chip mounting terminals with said at least some logic chip mounting terminals.

6. The assembly of claim 1, wherein said unit terminals are disposed in first and second stack terminal regions of one of said top or bottom surfaces and said MRAM chip mounting terminals are disposed between said first and second stack terminal regions.

7. The assembly of claim 1, wherein, in each individual unit, said MRAM chip is mounted directly opposite the package element from said logic chip.

8. The assembly of claim 1, wherein said first logic chip is a field programmable gate array.

9. The assembly of claim 4, wherein said circuit panel further comprises a top surface, a bottom surface, and conductive features, said unit terminals being mounted on said top surface of said circuit panel with said unit terminals electrically connected to at least some of said conductive features on said circuit panel.

* * * * *